(12) United States Patent
Suzuki et al.

(10) Patent No.: US 8,994,405 B1
(45) Date of Patent: Mar. 31, 2015

(54) SEMICONDUCTOR INTEGRATED CIRCUIT DEVICE

(71) Applicant: Kabushiki Kaisha Toshiba, Tokyo (JP)

(72) Inventors: Azuma Suzuki, Tokyo (JP); Hiroyuki Hara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/191,327

(22) Filed: Feb. 26, 2014

(51) Int. Cl.
*H03K 19/00* (2006.01)
*H03K 19/003* (2006.01)

(52) U.S. Cl.
CPC .............. *H03K 19/00315* (2013.01)
USPC ............................. 326/93; 326/98

(58) Field of Classification Search
None
See application file for complete search history.

(56) References Cited

U.S. PATENT DOCUMENTS

| | | | | |
|---|---|---|---|---|
| 5,691,652 A * | 11/1997 | Miller et al. | ...... | 326/26 |
| 5,850,150 A * | 12/1998 | Mitra et al. | ...... | 326/16 |
| 6,204,695 B1 * | 3/2001 | Alfke et al. | ...... | 326/93 |
| 6,397,374 B1 * | 5/2002 | Pasqualini | ...... | 326/49 |
| 6,734,703 B1 * | 5/2004 | Alfke et al. | ...... | 326/38 |
| 6,906,554 B1 * | 6/2005 | Chen | ...... | 326/93 |
| 6,933,750 B2 * | 8/2005 | Takahashi et al. | ...... | 326/82 |
| 7,764,085 B2 * | 7/2010 | Takahashi et al. | ...... | 326/82 |
| 8,390,329 B1 * | 3/2013 | Sridhara | ...... | 326/97 |
| 2002/0023253 A1 * | 2/2002 | Pasqualini | ...... | 716/8 |
| 2002/0056069 A1 * | 5/2002 | Abe et al. | ...... | 716/1 |
| 2002/0178427 A1 * | 11/2002 | Ding et al. | ...... | 716/12 |
| 2004/0012412 A1 * | 1/2004 | Takahashi et al. | ...... | 326/86 |
| 2005/0127946 A1 * | 6/2005 | Chen | ...... | 326/93 |
| 2005/0168243 A1 * | 8/2005 | Takahashi et al. | ...... | 326/83 |
| 2008/0231313 A1 * | 9/2008 | Miyazaki et al. | ...... | 326/16 |
| 2009/0134912 A1 * | 5/2009 | Habel et al. | ...... | 326/93 |

FOREIGN PATENT DOCUMENTS

| | | |
|---|---|---|
| JP | 2002141471 A | 5/2002 |
| JP | 2008-235440 A | 10/2008 |
| JP | 2011124387 A | 6/2011 |

* cited by examiner

*Primary Examiner* — Crystal L Hammond
(74) *Attorney, Agent, or Firm* — Patterson & Sheridan, LLP

(57) ABSTRACT

A semiconductor integrated circuit device includes a first flip-flop circuit receiving data in synchronization with a first clock signal, a logic circuit performing a predetermined process on data output from the first flip-flop circuit, a hold buffer delaying transmission of an output of the logic circuit, a second flip-flop circuit receiving an output of the hold buffer in synchronization with a second clock signal, and a power supply circuit capable of selecting a supply of a power supply voltage to the first flip-flop circuit, the logic circuit, and the second flip-flop circuit between a first power supply voltage and a second power supply voltage higher than the first power supply voltage. A power supply voltage supplied to the hold buffer remains the same when the power supply voltage supplied to the first flip-flop circuit, the logic circuit, and the second flip-flop circuit changes between first and second power supply voltages.

20 Claims, 3 Drawing Sheets

SEMICONDUCTOR INTEGRATED CIRCUIT DEVICE

CROSS-REFERENCE TO RELATED APPLICATION

This application is based upon and claims the benefit of priority from Japanese Patent Application No. 2013-185335, filed Sep. 6, 2013, the entire contents of which are incorporated herein by reference.

FIELD

Embodiments described herein relate generally to a semiconductor integrated circuit device for pipeline processing.

BACKGROUND

A semiconductor integrated circuit device for pipeline processing includes flip-flop circuits for receiving data in synchronization with a predetermined clock signal, and a hold buffer circuit between the flip-flop circuits that compensates for hold errors. The semiconductor integrated circuit device may be configured with two power sources for supplying power supply voltages to the circuits in a flexible manner in order to improve characteristics of the semiconductor integrated circuit.

However, if switching is performed between the power supply voltages, the characteristics of circuits integrated in the semiconductor device change. For example, if switching is performed between the power supply voltages, the delay time of the hold buffer circuit is influenced.

DETAILED DESCRIPTION

Embodiments provide a reliable semiconductor integrated circuit device which does not influence the delay time of a hold buffer circuit even if switching is performed between power supply voltages.

In general, according to one embodiment, a semiconductor integrated circuit device includes a first flip-flop circuit configured to receive data in synchronization with a first clock signal, a logic circuit configured to perform a predetermined process on data output from the first flip-flop circuit, a hold buffer circuit configured to delay transmission of an output of the random logic circuit, a second flip-flop circuit configured to receive an output of the hold buffer circuit in synchronization with a second clock signal, and a power supply circuit configured to select a supply of a power supply voltage to the first flip-flop circuit, the logic circuit, and the second flip-flop circuit between a first power supply voltage and a second power supply voltage higher than the first power supply voltage. A power supply voltage supplied to the hold buffer circuit remains the same even when the power supply voltage supplied to the first flip-flop circuit, the logic circuit, and the second flip-flop circuit changes between the first and second power supply voltages.

Hereinafter, with reference to the accompanying drawings, semiconductor integrated circuit devices according to embodiments will be described in detail. However, the present exemplary embodiment is not limited by the embodiments.

First Embodiment

Figure 1:
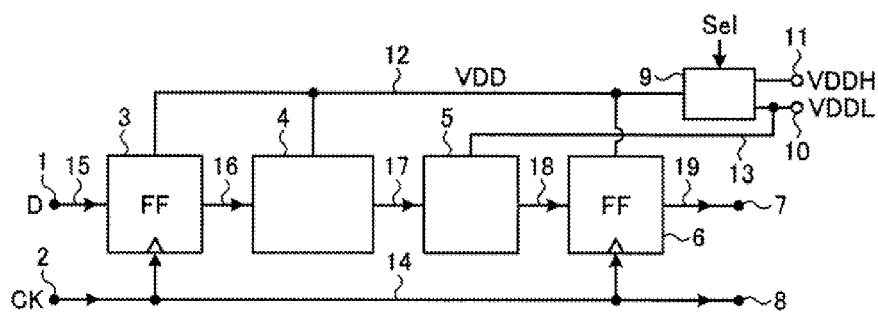
FIG. 1 is a view illustrating a semiconductor integrated circuit device of a first embodiment.

FIG. 1 is a view illustrating a semiconductor integrated circuit device of a first embodiment. Data D is supplied to a data input terminal 1. Thereafter, the data D is supplied to a flip-flop circuit 3 through a data transmission line 15. A clock signal CK is supplied to a clock signal input terminal 2. Thereafter, the clock signal CK is transmitted through a clock signal transmission line 14, and is supplied to a clock signal output terminal 8. The flip-flop circuit 3 receives the data D in synchronization with the clock signal CK which is supplied through the clock signal transmission line 14, and supplies the data D to a random logic circuit 4 of the next stage through a data transmission line 16. The random logic circuit 4 is a circuit designed using operators such as an adder, combinational circuits thereof, and so on to implement a desired function, and performs a predetermined process on the supplied data D. Also, FIG. 1 shows a configuration corresponding to one bit of the data D. In the case of multiple bits, a semiconductor integrated circuit device employs configurations identical to the configuration of FIG. 1 that are connected in parallel; however, a description of such a semiconductor integrated circuit device is omitted.

The output of the random logic circuit 4 is supplied to a hold buffer circuit 5 through a data transmission line 17. The output of the hold buffer circuit 5 is supplied to a flip-flop circuit 6 through a data transmission line 18. The hold buffer circuit 5 is a delay circuit for introducing a predetermined delay. The delay time of the hold buffer circuit 5 is appropriately set such that the flip-flop circuit 6 surely receives the output processed by the random logic circuit 4 in synchronization with the next cycle of the clock signal CK after the cycle in which the flip-flop circuit 3 received the data D, that is, such that the flip-flop circuit 6 does not generate a hold error.

The flip-flop circuit 6 receives the output of the hold buffer circuit 5 in synchronization with the clock signal CK, and supplies the received output to a data output terminal 7 through a data transmission line 19. At the next stage of the data output terminal 7, a random logic circuit (not shown) or the like for receiving the output of the data output terminal 7 or the like may be provided similarly; however, a description thereof is omitted.

A power supply switching circuit 9 includes a first power supply terminal 10 for receiving a first power supply voltage VDDL, and a second power supply terminal 11 for receiving a second power supply voltage VDDH. The second power supply voltage VDDH is set to a voltage higher than the first power supply voltage VDDL. For example, the first power supply voltage VDDL may be set to 1.2 V, and the second power supply voltage VDDH may be set to 1.5 V. The power supply switching circuit 9 switches between the first power supply voltage VDDL and the second power supply voltage VDDH, in response to a switching signal Sel so as to supply the first power supply voltage VDDL or the second power supply voltage VDDH as a power supply voltage VDD to a first power supply line 12. If the power supply voltage VDD is increased, it is possible to improve, for example, the drive capabilities of circuits integrated in the semiconductor integrated circuit device. A second power supply line 13 receives the first power supply voltage VDDL as a fixed voltage. The semiconductor integrated circuit device includes the hold buffer circuit 5, and is designed, for example, to be operated under a condition in a case where the first power supply voltage VDDL is applied as the power supply voltage VDD.

The flip-flop circuit 3, the random logic circuit 4, and the flip-flop circuit 6 are biased by a voltage that is applied to the first power supply line 12. The hold buffer circuit 5 is biased by the first power supply voltage VDDL. That is, the hold buffer circuit 5 is biased by the first power supply voltage VDDL even when the power supply voltage VDD to be supplied to other circuits is switched to the second power supply voltage VDDH by the power supply switching circuit 9. Through this configuration, a bias state of the hold buffer circuit 5 is maintained from when the delay time of the hold buffer circuit 5 was set, thereby preventing the delay time of the hold buffer circuit 5 from changing due to switching of the power supply voltage.

According to the first embodiment, even if the power supply voltage is switched, the first power supply voltage VDDL used at the stage of setting the delay time is continuously supplied to the hold buffer circuit 5. As a result, the delay time of the hold buffer circuit 5 does not change, and thus it is possible to avoid occurrence of a hold error. Therefore, it is possible to provide a reliable semiconductor integrated circuit device.

Figure 2:
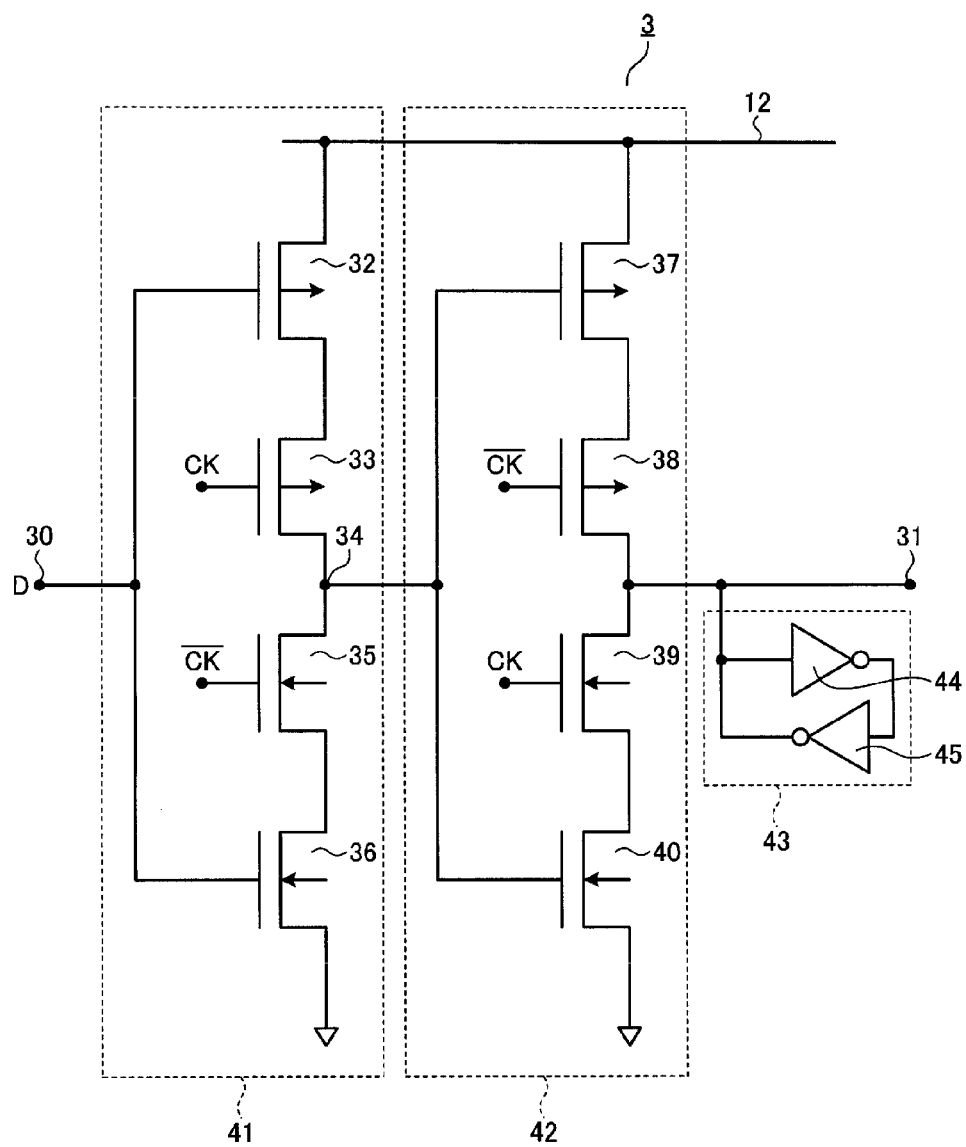
FIG. 2 is a view illustrating one embodiment of a flip-flop circuit.

FIG. 2 is a view illustrating an embodiment of a flip-flop circuit which is used in the semiconductor integrated circuit device of the embodiment of FIG. 1. One embodiment of the flip-flop circuit 3 is shown as a representative. The flip-flop circuit 3 includes clocked inverters 41 and 42 of two stages, and a latch circuit 43. The clocked inverter 41 includes a PMOS transistor 32 which has a gate electrode connected to an input terminal 30 and a source electrode connected to the first power supply line 12. The drain electrode of the PMOS transistor 32 is connected to the source electrode of a PMOS transistor 33. The drain electrode of the PMOS transistor 33 is connected to an output node 34. The output node 34 is connected to the drain electrode of an NMOS transistor 35. The source electrode of the NMOS transistor 35 is connected to the drain electrode of an NMOS transistor 36. The source electrode of the NMOS transistor 36 is grounded. The gate electrode of the NMOS transistor 36 is connected to the input terminal 30. To the input terminal 30, the data D is supplied. To the gate electrode of the PMOS transistor 33, the clock signal CK is supplied. To the gate electrode of the NMOS transistor 35, the inverted signal $\overline{CK}$ (hereinafter, referred to as /CK) of the clock signal CK is supplied.

The clocked inverter 42 includes a PMOS transistor 37 which has a gate electrode connected to the output node 34 of the clocked inverter 41 and a source electrode connected to the first power supply line 12. The drain electrode of the PMOS transistor 37 is connected to the source electrode of a PMOS transistor 38. The drain electrode of the PMOS transistor 38 is connected to an output terminal 31. The output terminal 31 is connected to the drain electrode of an NMOS transistor 39. The source electrode of the NMOS transistor 39 is connected to the drain electrode of an NMOS transistor 40. The source electrode of the NMOS transistor 40 is grounded. The gate electrode of the NMOS transistor 40 is connected to the output node 34 of the clocked inverter 41. To the gate electrode of the PMOS transistor 38, the inverted signal /CK of the clock signal CK is supplied. To the gate electrode of the NMOS transistor 39, the clock signal CK is supplied.

The latch circuit 43 includes inverters 44 and 45 of two stages connected in series. The input end of the inverter 44 is connected to the output terminal 31, and the output end of the inverter 44 is connected to the input end of the inverter 45. The output end of the inverter 45 is connected to the input end of the inverter 44 and the output terminal 31.

When the clock signal CK is at a low level, the PMOS transistor 33 and NMOS transistor 35 of the clocked inverter 41 are in ON states, and thus the clocked inverter 41 can receive the data D. Therefore, the data D is inverted, and is supplied to the output end 34.

When the clock signal CK is at a high level, the PMOS transistor 38 and NMOS transistor 39 of the clocked inverter 42 are in ON states, and thus can receive the output of the clocked inverter 41. Therefore, the output of the clocked inverter 41 is inverted, and is supplied to the output terminal 31. The output supplied to the output terminal 31 is held by the latch circuit 43. By this operation, the flip-flop circuit 3 supplies the data D to the output terminal 31 in synchronization with a rising of the clock signal CK. The data D supplied to the output terminal 31 is supplied to the random logic circuit 4 of the next stage through the data transmission line 16.

Figure 3:
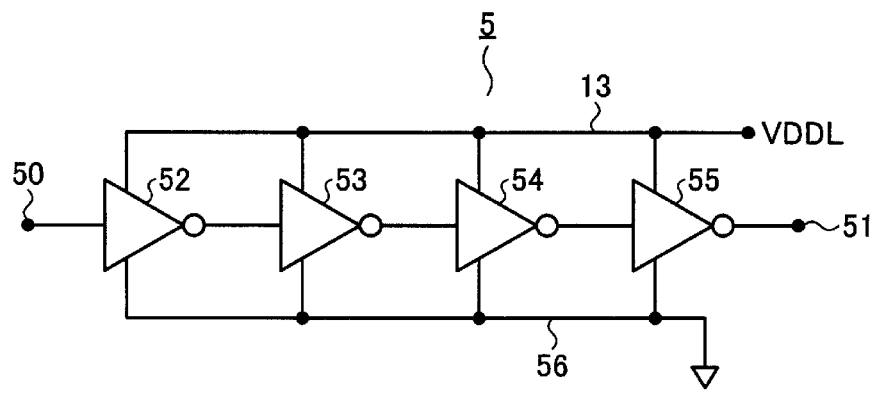
FIG. 3 is a view illustrating one embodiment of a hold buffer circuit.

FIG. 3 is a view illustrating one embodiment of the hold buffer circuit 5 which is used in the semiconductor integrated circuit device of the embodiment of FIG. 1. The hold buffer circuit 5 includes inverter circuits 52 to 55 of four stages connected in series. Each of the inverter circuits 52 to 55 of the four stages is biased by the first power supply voltage VDDL supplied to the second power supply line 13. The low potential side of each of the inverter circuits 52 to 55 of the four stages is grounded through a power supply line 56. The hold buffer circuit 5 delays a signal supplied to an input terminal 50 by a predetermined time, and then supplies the delayed signal to an output terminal 51. The signal supplied to the output terminal 51 is supplied to the flip-flop circuit 6 of the next stage through the data transmission line 18.

The number of stages of inverter circuits in the hold buffer circuit 5 is set according to a set value of a delay time which is required in the hold buffer circuit 5. The delay time is set such that the output of the random logic circuit 4 is supplied to the flip-flop circuit 6 of the next stage at a predetermined timing. The hold buffer circuit 5 is designed, for example, under a condition in which the first power supply voltage VDDL is applied as the power supply voltage, and the delay time is set.

Figure 4:
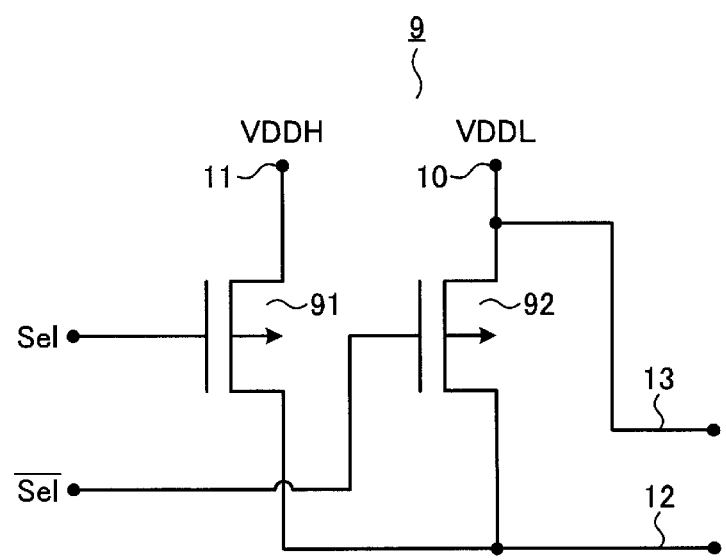
FIG. 4 is a view illustrating one embodiment of a power supply switching circuit.

FIG. 4 is a view illustrating one embodiment of the power supply switching circuit 9 which is used in the semiconductor integrated circuit device of the embodiment of FIG. 1. The power supply switching circuit 9 includes a PMOS transistor 91 whose source electrode is connected to the second power supply terminal 11 to which the second power supply voltage VDDH is applied. To the gate electrode of the PMOS transistor 91, the switching signal Sel is supplied. The drain electrode of the PMOS transistor 91 is connected to the first power supply line 12. The power supply switching circuit 9 includes a PMOS transistor 92 whose source electrode is connected to the first power supply terminal 10 to which the first power supply voltage VDDL is applied. To the gate electrode of the PMOS transistor 92, the inverted signal $\overline{Sel}$ (hereinafter, referred to as /Sel) of the switching signal Sel is supplied. The drain electrode of the PMOS transistor 92 is connected to the first power supply line 12. The first power supply terminal 10 to which the first power supply voltage VDDL is applied is connected to the second power supply line 13.

When the switching signal Sel is at a low level, the PMOS transistor 91 is in an ON state, and thus the second power supply voltage VDDH is supplied to the first power supply line 12. Therefore, the flip-flop circuit 3, the random logic circuit 4, and the flip-flop circuit 6 are biased by the second power supply voltage VDDH. If the switching signal Sel becomes a high level, the PMOS transistor 92 receiving the inverted signal /Sel of the switching signal Sel is turned on, and thus the first power supply voltage VDDL is supplied to the first power supply line 12. In this way, the power supply voltage switched according to the switching signal Sel is supplied to the first power supply line 12. To the second power supply line 13 to which the power supply voltage to bias the hold buffer circuit 5 is applied, the first power supply voltage VDDL is supplied as a fixed voltage, without being affected by the power supply switching circuit 9. As a result, a change of the delay time of the hold buffer circuit 5 according to switching of the power supply voltage can be prevented.

It is also possible to set the delay time of the hold buffer circuit 5 under a condition of the second power supply voltage VDDH. In this case, the semiconductor integrated circuit device is configured such that the second power supply voltage VDDH is supplied to the hold buffer circuit 5. As a result, a change of the delay time of the hold buffer circuit 5 according to switching of the power supply voltage, and thus the occurrence of a hold error, can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit device comprising:
   a first flip-flop circuit configured to receive data in synchronization with a first clock signal;
   a logic circuit configured to perform a predetermined process on data output from the first flip-flop circuit;
   a hold buffer circuit configured to delay transmission of an output of the logic circuit;
   a second flip-flop circuit configured to receive an output of the hold buffer circuit in synchronization with a second clock signal; and
   a power supply circuit configured to select a supply of a power supply voltage to the first flip-flop circuit, the logic circuit, and the second flip-flop circuit between a first power supply voltage and a second power supply voltage higher than the first power supply voltage,
   wherein a power supply voltage supplied to the hold buffer circuit remains the same even when the power supply voltage supplied to the first flip-flop circuit, the logic circuit, and the second flip-flop circuit changes between the first and second power supply voltages.

2. The semiconductor integrated circuit device according to claim 1, wherein
   the first flip-flop circuit, the second flip-flop circuit, the logic circuit, and the hold buffer circuit are designed under a condition in which the first power supply voltage is applied, and the power supply voltage supplied to the hold buffer circuit remains at the first power supply voltage even when the power supply voltage supplied to the first flip-flop circuit, the logic circuit, and the second flip-flop circuit changes from the first power supply voltage to the second power supply voltage.

3. The semiconductor integrated circuit device according to claim 1, wherein
   the first flip-flop circuit, the second flip-flop circuit, the logic circuit, and the hold buffer circuit are designed under a condition in which the second power supply voltage is applied, and the power supply voltage supplied to the hold buffer circuit remains at the second power supply voltage even when the power supply voltage supplied to the first flip-flop circuit, the logic circuit, and the second flip-flop circuit changes from the second power supply voltage to the first power supply voltage.

4. The semiconductor integrated circuit device according to claim 1, further comprising:
   a first power supply line that connects an output of the power supply circuit to power supply inputs of the first flip-flop circuit, the logic circuit, and the second flip-flop circuit, and
   a second power supply line that supplies one of the first and second power supply voltages to an input of the hold buffer circuit.

5. The semiconductor integrated circuit device according to claim 4, wherein
   the hold buffer circuit includes inverter circuits of an even number of stages connected in series.

6. The semiconductor integrated circuit device according to claim 4, further comprising:
   a clock signal supply line connected to a clock input of the first flip-flop circuit to supply the first clock signal and to a clock input of the second flip-flop circuit to supply the second clock signal.

7. The semiconductor integrated circuit device according to claim 1, further comprising:
   a high voltage power supply line connected to a first power supply input of the power supply circuit;
   a low voltage power supply line connected to a second power supply input of the power supply circuit;
   a variable voltage power supply line connected between an output of the power supply circuit and power supply inputs of the first flip-flop circuit, the logic circuit, and the second flip-flop circuit; and
   a bypass power supply line connected between one of the high and low voltage power supply lines and a power supply input of the hold buffer circuit.

8. A semiconductor integrated circuit device comprising:
   a first flip-flop circuit configured to receive data in synchronization with a first clock signal;
   a logic circuit configured to perform a predetermined process on data output from the first flip-flop circuit;
   a hold buffer circuit configured to delay transmission of an output of the logic circuit;
   a second flip-flop circuit configured to receive an output of the hold buffer circuit in synchronization with a second clock signal;
   a power supply circuit configured to select a supply of a power supply voltage to the first flip-flop circuit, the logic circuit, and the second flip-flop circuit between a first power supply voltage and a second power supply voltage higher than the first power supply voltage;
   a first power supply line that connects an output of the power supply circuit to power supply inputs of the first flip-flop circuit, the logic circuit, and the second flip-flop circuit; and
   a second power supply line that supplies one of the first and second power supply voltages to an input of the hold buffer circuit.

9. The semiconductor integrated circuit device according to claim 8, wherein
the first flip-flop circuit, the second flip-flop circuit, the logic circuit, and the hold buffer circuit are designed under a condition in which the first power supply voltage is applied, and the power supply voltage supplied to the hold buffer circuit remains at the first power supply voltage even when the power supply voltage supplied to the first flip-flop circuit, the logic circuit, and the second flip-flop circuit changes from the first power supply voltage to the second power supply voltage.

10. The semiconductor integrated circuit device according to claim 8, wherein
the first flip-flop circuit, the second flip-flop circuit, the logic circuit, and the hold buffer circuit are designed under a condition in which the second power supply voltage is applied, and the power supply voltage supplied to the hold buffer circuit remains at the second power supply voltage even when the power supply voltage supplied to the first flip-flop circuit, the logic circuit, and the second flip-flop circuit changes from the second power supply voltage to the first power supply voltage.

11. The semiconductor integrated circuit device according to claim 8, wherein
the hold buffer circuit includes inverter circuits of an even number of stages connected in series.

12. The semiconductor integrated circuit device according to claim 8, further comprising:
a clock signal supply line connected to a clock input of the first flip-flop circuit to supply the first clock signal and to a clock input of the second flip-flop circuit to supply the second clock signal.

13. The semiconductor integrated circuit device according to claim 8, further comprising:
a high voltage power supply line connected to a first power supply input of the power supply circuit; and
a low voltage power supply line connected to a second power supply input of the power supply circuit,
wherein the one of the high and low voltage power supply lines is directly connected to the second power supply line.

14. A method of processing data through serially connected circuit elements of a semiconductor integrated circuit device that include a first flip-flop circuit, a logic circuit, a hold buffer circuit, and a second flip-flop circuit, said method comprising:
receiving data in the first flip-flop circuit in synchronization with a first clock signal;
performing a predetermined process on data output from the first flip-flop circuit with the logic circuit;
delaying transmission of an output of the logic circuit with the hold buffer circuit;
receiving an output of the hold buffer circuit in a second flip-flop circuit in synchronization with the second clock signal; and
selecting a supply of a power supply voltage to the first flip-flop circuit, the logic circuit, and the second flip-flop circuit between a first power supply voltage and a second power supply voltage higher than the first power supply voltage,
wherein a power supply voltage supplied to the hold buffer circuit remains the same even when the power supply voltage supplied to the first flip-flop circuit, the logic circuit, and the second flip-flop circuit changes between the first and second power supply voltages.

15. The method according to claim 14, wherein
the first flip-flop circuit, the second flip-flop circuit, the logic circuit, and the hold buffer circuit are designed under a condition in which the first power supply voltage is applied, and the power supply voltage supplied to the hold buffer circuit remains at the first power supply voltage even when the power supply voltage supplied to the first flip-flop circuit, the logic circuit, and the second flip-flop circuit changes from the first power supply voltage to the second power supply voltage.

16. The method according to claim 14, wherein
the first flip-flop circuit, the second flip-flop circuit, the logic circuit, and the hold buffer circuit are designed under a condition in which the second power supply voltage is applied, and the power supply voltage supplied to the hold buffer circuit remains at the second power supply voltage even when the power supply voltage supplied to the first flip-flop circuit, the logic circuit, and the second flip-flop circuit changes from the second power supply voltage to the first power supply voltage.

17. The method according to claim 14, wherein the semiconductor integrated circuit device further includes:
a first power supply line that connects an output of the power supply circuit to power supply inputs of the first flip-flop circuit, the logic circuit, and the second flip-flop circuit, and
a second power supply line that supplies one of the first and second power supply voltages to an input of the hold buffer circuit.

18. The method according to claim 17, wherein
the hold buffer circuit includes inverter circuits of an even number of stages connected in series.

19. The method according to claim 14, wherein the semiconductor integrated circuit device further includes:
a clock signal supply line connected to a clock input of the first flip-flop circuit to supply the first clock signal and to a clock input of the second flip-flop circuit to supply the second clock signal.

20. The method according to claim 14, wherein the semiconductor integrated circuit device further includes:
a high voltage power supply line connected to a first power supply input of the power supply circuit;
a low voltage power supply line connected to a second power supply input of the power supply circuit;
a variable voltage power supply line connected between an output of the power supply circuit and power supply inputs of the first flip-flop circuit, the logic circuit, and the second flip-flop circuit; and
a bypass power supply line connected between one of the high and low voltage power supply lines and a power supply input of the hold buffer circuit.

* * * * *